US00RE45247E

(19) United States
(12) Reissued Patent
Kim

(10) Patent Number: US RE45,247 E
(45) Date of Reissued Patent: Nov. 18, 2014

(54) DUTY CYCLE CORRECTION CIRCUIT OF DELAY LOCKED LOOP AND DELAY LOCKED LOOP HAVING THE DUTY CYCLE CORRECTION CIRCUIT

(75) Inventor: Chan-kyung Kim, Hwaseong (KR)

(73) Assignee: Conversant Intellectual Property Management Inc., Plano, TX (US)

(21) Appl. No.: 13/405,703

(22) Filed: Feb. 27, 2012

Related U.S. Patent Documents

Reissue of:
(64) Patent No.: 7,671,651
Issued: Mar. 2, 2010
Appl. No.: 11/512,155
Filed: Aug. 30, 2006

U.S. Applications:
(62) Division of application No. 10/798,484, filed on Mar. 12, 2004, now Pat. No. 7,119,594.

(30) Foreign Application Priority Data

Mar. 13, 2003 (KR) ..... 2003-15863

(51) Int. Cl.
*H03L 7/00* (2006.01)

(52) U.S. Cl.
USPC ..... 327/161; 327/175

(58) Field of Classification Search
None
See application file for complete search history.

(56) References Cited

U.S. PATENT DOCUMENTS

| | | | | |
|---|---|---|---|---|
| 5,945,862 | A | 8/1999 | Donnelly et al. | |
| 6,181,178 | B1 | 1/2001 | Choi | |
| 6,292,042 | B1 | 9/2001 | Kim et al. | |
| 6,342,801 | B1 | 1/2002 | Shin | |
| 6,628,556 | B2 | 9/2003 | Huber | |
| 6,643,787 | B1 | 11/2003 | Zerbe et al. | |
| 6,643,790 | B1 | 11/2003 | Yu | |
| 6,680,637 | B2 | 1/2004 | Seo | |
| 6,735,669 | B2 | 5/2004 | Shin | |
| 6,853,225 | B2 | 2/2005 | Lee | |
| 6,963,235 | B2 | 11/2005 | Lee | |
| 7,116,149 | B2 | 10/2006 | Kim | |
| 7,171,575 | B1 | 1/2007 | Plants et al. | |
| 2002/0153936 | A1* | 10/2002 | Zerbe | 327/336 |

* cited by examiner

*Primary Examiner* — Cassandra Cox
(74) *Attorney, Agent, or Firm* — Conley Rose, P.C.; J. Robert Brown, Jr.

(57) ABSTRACT

A duty cycle correction circuit and a delay locked loop (DLL) including the duty cycle correction circuit, are capable of controlling their operation in order to correctly analyze the cause of generation of a duty cycle error when the duty cycle error is generated in the DLL. The duty cycle correction circuit selectively outputs to a DLL core duty cycle offset information for controlling a duty cycle of an internal clock signal synchronized to an external clock signal under the control of a switching control signal. The DLL corrects the duty cycle of a reference clock signal according to the duty cycle offset information, thereby outputting a reference clock signal having a 50% duty cycle.

41 Claims, 4 Drawing Sheets

DUTY CYCLE CORRECTION CIRCUIT OF DELAY LOCKED LOOP AND DELAY LOCKED LOOP HAVING THE DUTY CYCLE CORRECTION CIRCUIT

Matter enclosed in heavy brackets [ ] appears in the original patent but forms no part of this reissue specification; matter printed in italics indicates the additions made by reissue.

CROSS-REFERENCE TO RELATED APPLICATION(S)

This is a divisional of U.S. patent application Ser. No. 10/798,484, filed 12 Mar. 2004 now U.S. Pat. No. 7,119,594, the contents which are incorporated herein by reference in their entirety, and also claims the priority benefit under 35 U.S.C. § 119 from Korean Patent Application 2003-0015863, filed on 13 Mar. 2003, the contents of which are also incorporated herein by reference in their entirety.

BACKGROUND AND SUMMARY

1. Technical Field

The present invention relates to a duty cycle correction circuit of a delay locked loop (DLL) and a delay locked loop including the duty cycle correction circuit, and more particularly to a duty cycle correction circuit including a switching circuit and a delay locked loop (DLL) including the duty cycle correction circuit, for efficiently analyzing the cause of generation of a duty cycle error.

2. Description

Generally, a Delay Locked Loop (DLL) receives an external clock signal input from the outside of a system and generates an internal clock signal synchronized to the external clock signal. The system includes logic devices, semiconductor devices, etc., using the internal clock signal.

The DLL can be utilized in a cache memory device (instead of an SRAM device that is generally used) for increasing a data processing rate between a CPU and DRAM, or applied to a synchronous DRAM, a RAMBUS DRAM®, etc., as well as various types of logic devices.

The Double Data rate (DDR) technique has been developed for improving the bandwidth of a memory system. A DDR memory system uses the rising edge and falling edge of the internal clock signal. The duty cycle of the internal clock signal is an important factor for maintaining the maximum timing margin in a high performance memory system.

When the duty cycle of the internal clock signal is not maintained at exactly 50%, the deviation of the duty cycle from 50% reduces the timing margin of a high performance memory system. For this reason, an apparatus for compensating for distortion of the duty cycle due to changes of processes, voltages, and temperatures, is necessary. A duty cycle correction circuit utilized in a DLL is a circuit for correcting the duty cycle of the internal clock signal.

FIG. 1 is a block diagram of a conventional delay locked loop (DLL). Referring to FIG. 1, the DLL 100 includes a DLL core 110, a clock buffer 130, and a duty cycle correction circuit 150.

The DLL core 110, an essential part of the DLL, receives an external clock signal ECLK and generates an internal clock signal ICLK synchronized to the external clock signal ECLK.

The clock buffer 130 includes a plurality of serially interconnected inverters 131, 133, 135, . . . , 137, and buffers the internal clock signal ICLK to generate a reference clock signal CLK and a complementary reference clock signal CLKB.

The inverter 131 includes one PMOS transistor P1 and one NMOS transistor N1, which are serially connected between a source voltage VDD and a ground voltage VSS. The structures of the remaining inverters 133, 135, . . . , 137 are the same as that of the inverter 131. The process for generating the reference clock signal CLK and the complementary reference clock signal CLKB is well known in the art.

When the channel length to channel width ratio of the PMOS transistor P1 and NMOS transistor N1 is the same in each of the inverters 131, 133, 135, . . . , 137, then the clock buffer 130 can output differential reference clock signals CLK and CLKB having a duty cycle of 50%.

However, if the duty cycle of the differential reference clock signals CLK and CLKB becomes 45% or 55% (hereinafter, referred to as "case when a duty cycle error is generated"), or not exactly 50%, due to changes in a process, voltage, and temperature, then the timing margin of the high performance memory system is reduced.

To avoid this problem, the duty cycle correction circuit 150 converts the differential reference clock signals CLK and CLKB into duty cycle offset information DCC and DCCB, and feeds back the duty cycle offset information DCC and DCCB to the DLL core 110. Thus, the DLL core 110 controls the duty cycle of the internal clock signal ICLK to be exactly 50% in response to the duty cycle offset information DCC and DCCB.

Since the duty cycle correction circuit 150 always operates while the DLL 100 is operating, it is not known whether the differential reference clock signals CLK and CLKB having the 50% duty cycle are generated by the interaction of the clock buffer 130 and the duty cycle correction circuit 150, or by the greater operation of the clock buffer 130 rather than that of the duty cycle correction circuit 150.

Thus, when a duty cycle error is generated, it is impossible to correctly analyze whether the duty cycle error is generated by the clock buffer 130 or by the duty cycle correction circuit 150.

Therefore, it would be desirable to provide a duty cycle correction circuit and a delay locked loop (DLL) including the duty cycle correction circuit, where the DLL is capable of controlling its operation in order to correctly analyze the cause of a duty cycle error when a duty cycle error is generated in the DLL.

According to one aspect of the present invention, a duty cycle correction circuit of a delay locked loop comprises: a differential amplifier which receives and amplifies differential reference signals input from a first input terminal and a second input terminal, and outputs differential output signals to a first differential output terminal and a second differential output terminal; a first transmission circuit which is connected between the first differential output terminal and a first node, and transmits a signal of the first differential output terminal to the first node under the control of control signals; a second transmission circuit which is connected between the second differential output terminal and a second node, and transmits a signal of the second differential output terminal to the second node under the control of the control signals; a first storage unit which is connected between the first node and a ground voltage and stores a signal of the first node; a second storage unit which is connected between the second node and the ground voltage and stores a signal of the second node; and a switching circuit which connects the first node to a first output terminal and the second node to a second output terminal under the control of a switching control signal.

The switching circuit comprises: a third transmission circuit which transmits the signal of the first node to the first output terminal when a switching control signal has a deactivated state; a fourth transmission circuit which transmits the signal of the second node to the second output terminal when the switching control signal has the deactivated state; a first voltage supplying circuit which is connected between the first output terminal and the ground voltage, and supplies the ground voltage to the first output terminal when a switching control signal has an activated state; and a second voltage supplying circuit which is connected between the second output terminal and the ground voltage, and supplies the ground voltage to the second output terminal when the switching control signal has the activated state.

The first transmission circuit through the fourth transmission circuit each include a PMOS transistor and a NMOS transistor. The first storage unit and the second storage unit each include a MOS transistor.

According to another aspect of the present invention, a delay locked loop comprises: a DLL core which receives an external clock signal and generates an internal clock signal synchronized to the external clock signal; a buffer which buffers the internal clock signal and outputs differential reference clock signals; and a duty cycle correction circuit which generates first control signals having desired offsets corresponding to differences in the duty cycles of each of the differential reference clock signals, and outputs the first control signals to the DLL core under the control of a switching control signal, wherein the DLL core corrects a duty cycle of the internal clock signal under the control of the first control signals, wherein in a duty-cycle error analysis mode, the switching control signal selectively controls the duty cycle correction circuit to inhibit output of the first control signals to the DLL core.

The delay locked loop further comprises a pad for receiving the switching control signal. The delay locked loop further comprises a mode register set for generating the switching control signal.

According to another yet aspect of the present invention, a duty cycle correction circuit, comprises: input terminal adapted to receive a pair of differential reference clock signals each having a duty cycle; integrating means for integrating each of the reference clock signals to produce a pair of control signals indicating the duty cycles of the differential reference clock signals; and switching means adapted to receive a switching control signal and in response thereto to selectively output the control signals when the switching control signal has a first state and to output a pair of fixed voltage signals when the switching control signal has a second state.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, embodiments of the present invention will be described in detail with reference to the appended drawings. In respective drawings, components denoted by a same reference number represent a same component.

Figure 1:
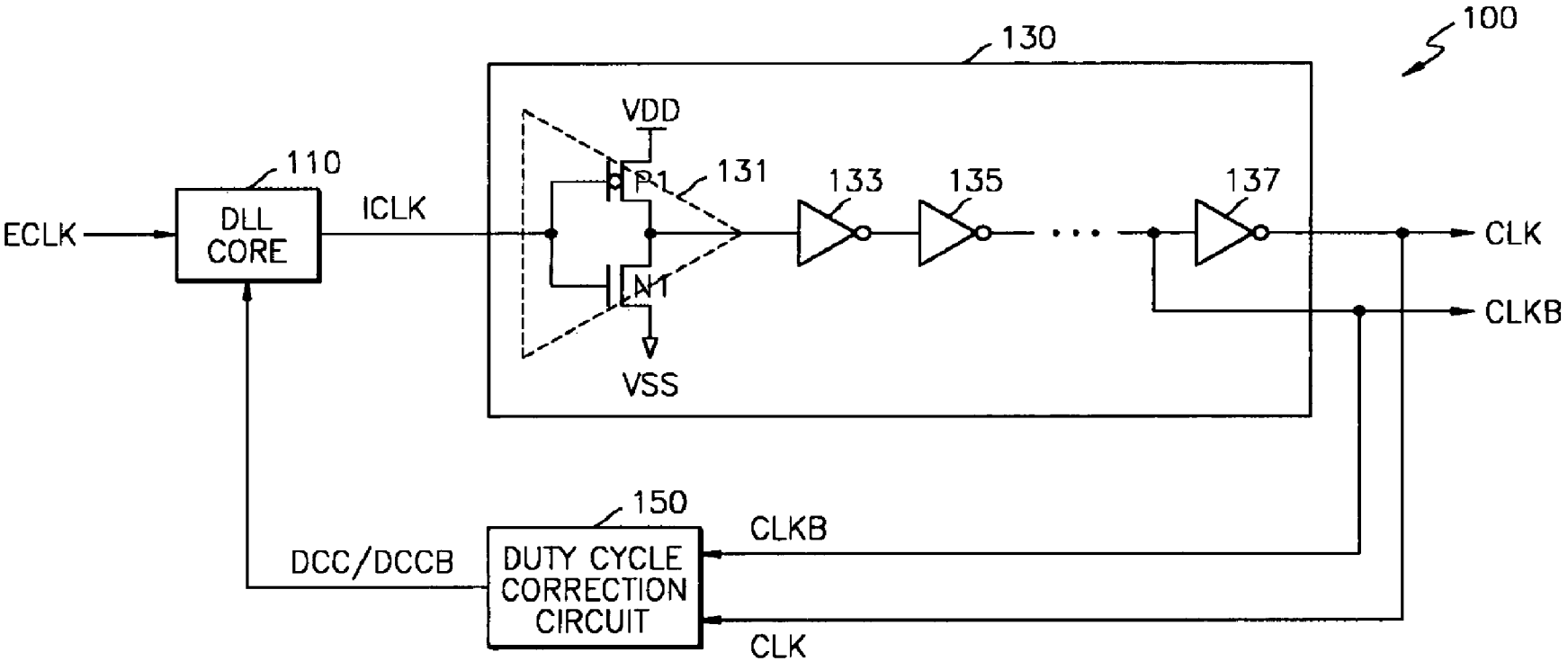
FIG. 1 is a block diagram of a conventional delay locked loop.
Figure 2:
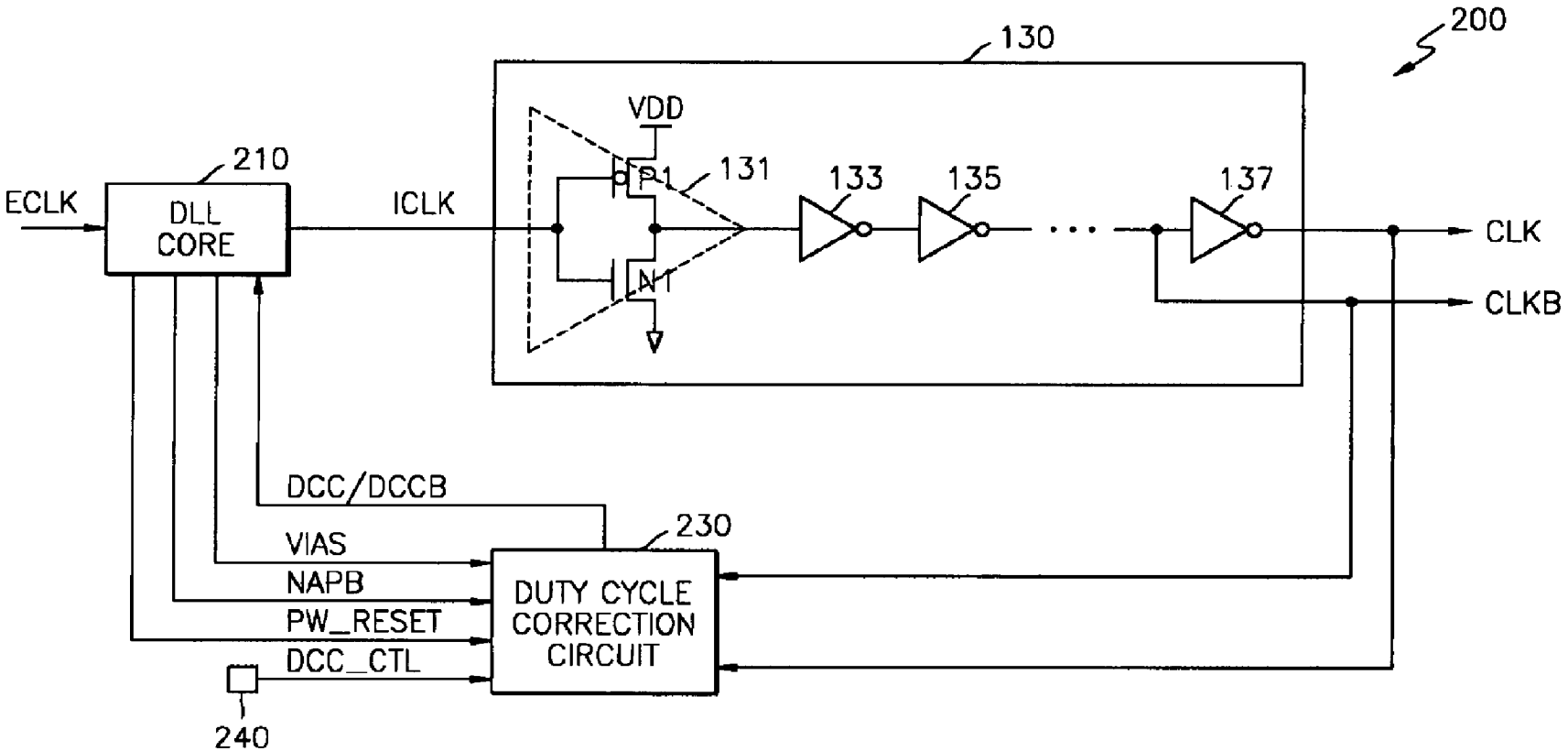
FIG. 2 is a block diagram of a delay locked loop according to a preferred embodiment.

FIG. 2 is a block diagram of a delay locked loop according to a preferred embodiment. Referring to FIG. 2, the delay locked loop (also, referred to as DLL) 200 includes a DLL core 210, a clock buffer 130, a duty cycle correction circuit 230, and a pad 240.

The DLL core 210 receives an external clock signal ECLK and generates an internal clock signal ICLK synchronized to the external clock signal ECLK. The clock buffer 130 buffers the internal clock signal ICLK and generates differential reference clock signals CLK and CLKB.

The duty cycle correction circuit 230 generates first control signals DCC and DCCB having desired offsets corresponding to differences between respective duty cycles of the differential reference clock signals CLK and CLKB, and outputs the first control signals DCC and DCCB to the DLL core 210. The generation and subsequent output of the control signals DCC and DCCB is performed under the control of a switching control signal DCC_CTL input from outside of the DLL 200 through the pad 240.

The DLL core 210 corrects the duty cycle of the internal clock signal ICLK under the control of the first control signals DCC and DCCB. The first control signals DCC and DCCB include duty cycle offset information.

The switching control signal DCC_CTL can be generated by a mode register set (MRS) or logic register.

Figure 3:
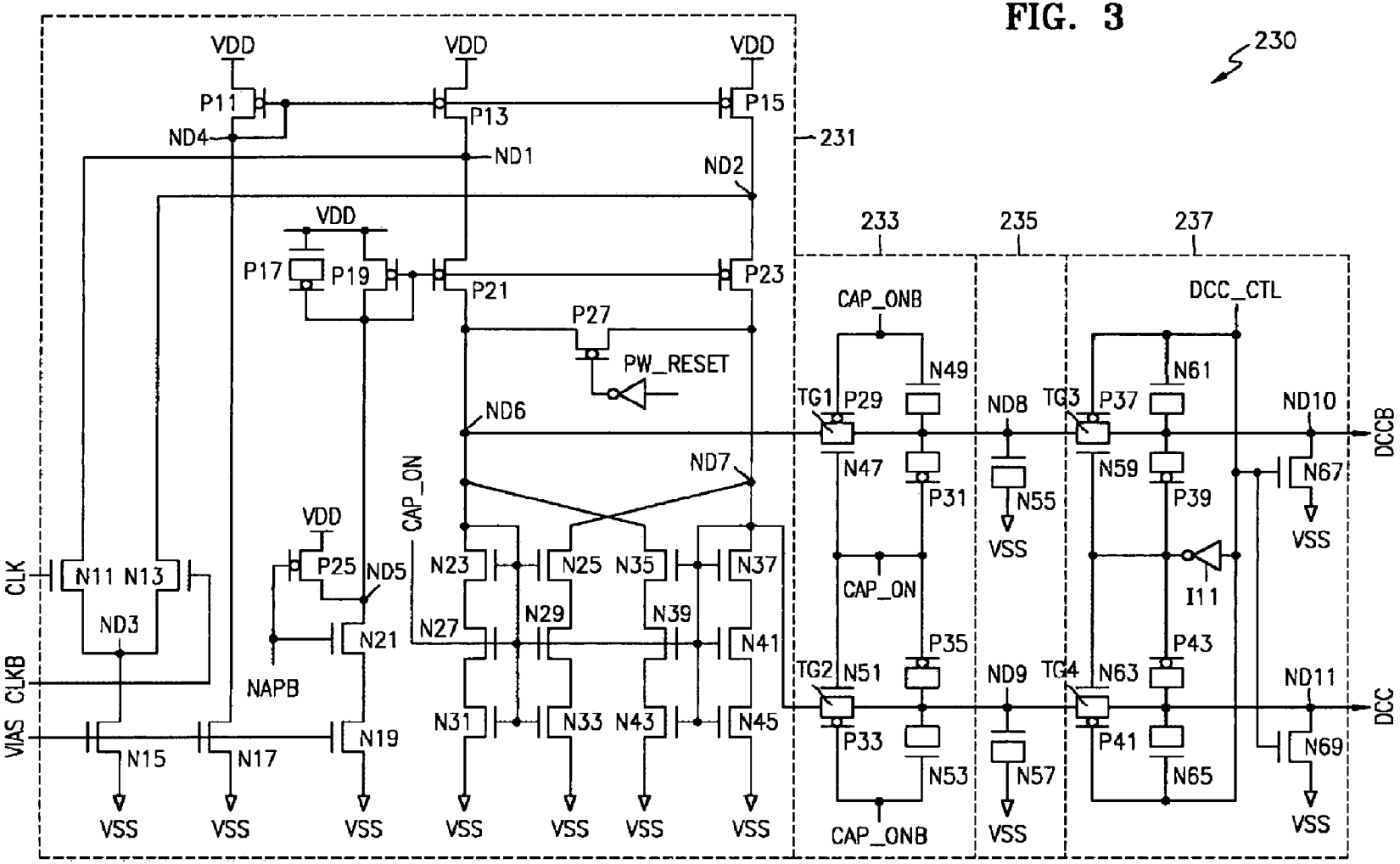
FIG. 3 is a circuit diagram of a duty cycle correction circuit of a delay locked loop, according to a preferred embodiment.

FIG. 3 is a circuit diagram of the duty cycle correction circuit of the delay locked loop, according to a preferred embodiment. Referring to FIG. 3, the duty cycle correction circuit 230 includes a differential amplifier 231, a transmission circuit 233, a storage unit 235, and a switching circuit 237.

The differential amplifier 231 receives a reference clock signal CLK input via the gate (hereinafter, referred to as "a first input terminal") of an NMOS transistor N11 and a complementary reference clock signal CLKB input via the gate (hereinafter, referred to as "a second input terminal") of an NMOS transistor N13, amplifies the difference between both reference clock signals CLK and CLKB, and outputs the amplified differential output signals to a first differential output node ND6 and a second differential output node ND7, respectively.

The transmission circuit 233 includes a first transmission circuit TG1 and a second transmission circuit TG2. The first transmission circuit TG1 is comprised of a PMOS transistor P29 and an NMOS transistor N47. The second transmission circuit TG2 is comprised of a PMOS transistor P33 and a NMOS transistor N51.

The first transmission circuit TG1 is connected between the first differential output terminal ND6 and a first node ND8, and transmits a signal of the first differential output terminal ND6 to the first node ND8 under the control of control signals CAP_ON and CAP_ONB.

The second transmission circuit TG2 is connected between the second differential output terminal ND7 and a second node ND9, and transmits a signal of the second differential output terminal ND7 to the second node ND9 under the control of the control signals CAP_ON and CAP_ONB. The control signals CAP-ON and CAP-ONB are complementary signals.

The storage unit 235 includes a first storage unit N55 and a second storage unit N57. The first storage unit N55 is connected between the first node ND8 and a ground voltage VSS and stores the signal of the first node ND8. The first storage unit N55 is comprised of an NMOS transistor.

The second storage unit N57 is connected between the second node ND9 and the ground voltage VSS and stores the signal of the second node ND9. The second storage unit N57 is also comprised of an NMOS transistor.

The switching circuit 237 connects the first node ND8 to a first output node ND10, and the second node ND9 to a second output node ND11, respectively, under the control of a switching control signal DCC_CTL. The switching circuit 237 includes a third transmission circuit TG3, a fourth transmission circuit TG4, a first voltage supplying circuit N67, and a second voltage supplying circuit N69.

The third transmission circuit TG3 is comprised of a PMOS transistor P37 and an NMOS transistor N59, and transmits the signal of the first node ND8 to the first output terminal ND10 when the switching control signal DCC_CTL is in a deactivated state (logic "low").

The fourth transmission circuit TG4 is comprised of a PMOS transistor P41 and a NMOS transistor N63, and transmits the signal of the second node ND9 to the second output terminal ND11 when the switching control signal DCC_CTL is in the deactivated state (logic "low").

The first voltage supplying circuit N67 is connected between the first output terminal ND10 and the ground voltage VSS, and supplies the ground voltage VSS to the first output terminal ND10 when the switching control signal DCC_CTL is activated (logic "high"). When the first voltage supplying circuit N67 is implemented by an NMOS transistor, then the first output terminal ND10 is pulled down to the ground voltage VSS when the switching control signal DCC_CTL is activated.

The second voltage supplying circuit N69 is connected between the second output terminal ND11 and the ground voltage VSS, and supplies the ground voltage VSS to the second output terminal ND11, when the switching control signal DCC_CTL is in the activated. When the second voltage supplying circuit N69 is implemented by a NMOS transistor, then the second output terminal ND11 is pulled down to the ground voltage VSS when the switching control signal DCC_CTL is activated.

The operation of the duty cycle correction circuit 230 of the delay locked loop will now be described with reference to FIGS. 2 and 3. First, the detailed operation of the differential amplifier 231 is described as follows.

If a bias voltage VIAS output from the DLL core 211 is activated to a "high" level, NMOS transistors N15, N17, and N19 and PMOS transistors P11, P13, and P15, each of which acts as a current source, are turned-on, and accordingly the differential amplifier 231 is operated.

If a mode control signal NAPB is also activated to a "high" level, then the NMOS transistor N21 is turned-on, and the voltage of the node ND5 is pulled down to the ground voltage VSS via the turned-on NMOS transistors N21 and N19. Since the voltage of the node ND5 is pulled down to the ground voltage VSS, a PMOS type capacitor P17 and PMOS transistors P19, P21, and P23 each having a current mirror structure, are turned-on.

Also, the voltages of nodes ND1 and ND2 are differentially amplified by the NMOS transistors N11 and N13, respectively, which are turned-on or turned-off according to the states of the differential reference clock signals CLK and CLKB. The amplified signals of the nodes ND1 and ND2 are transferred to the first differential output terminal ND6 and second differential output terminal ND7 via the turned-on PMOS transistors P21 and P23, respectively.

Any output terminal being in a "high" level among the differential output terminals ND6 and ND7 is changed to a "low" level since a current path to the ground voltage VSS is formed through NMOS transistors N27, N29, N39, and N41 when they are turned on by the activation of the control signal CAP_ON.

Also, any output terminal being in a "low" level among the differential output terminals ND6 and ND7 is pulled up to a "high" level by a source voltage VDD supplied through the PMOS transistors P13, P15, P21, and P23 having a current mirror structure, since the current path to the ground voltage VSS is not formed.

Accordingly, when the bias voltage VIAS has a "high" level, the mode control signal NAPB has a "high" level, and a power reset signal PW_RESET has a "low" level, then a differential signal corresponding to the differential reference clock signals CLK and CLKB is output to the differential output terminals ND6 and ND7, respectively.

Meanwhile, in the case where the bias voltage VIAS has a "high" level, both the mode control signal NAPB and the control signal CAP_ON have "low" levels, and the power reset signal PW_RESET has a "high" level, the NMOS transistor N21 is turned-off, the PMOS transistor P25 is turned-on, and accordingly, the voltage of the node ND5 becomes a "high" level. Therefore, the PMOS type capacitor P17 and the PMOS transistors P11, P13, and P15 having the current mirror structure are turned-off respectively.

When the respective NMOS transistors N27, N29, N39, and N41 are turned-off, the differential amplifier 231 does not operate. At this time, the differential output terminals ND6 and ND7 are equalized by the PMOS transistor P27.

The control signal CAP_ON is input into the gates of the NMOS transistors N47 and N51 and the gates of the PMOS transistors P31 and P35. The complementary control signal CAP_ONB is input into the gates of the NMOS transistors N49 and N53 and the gates of the PMOS transistors P29 and P33. The NMOS transistor N49 and PMOS transistor P31, and the NMOS transistor N53 and PMOS transistor P35 form capacitors.

The first transmission circuit TG1 transmits the signal of the first differential output terminal ND6 to the first node ND8 under the control of the control signals CAP_ON and CAP_ONB. The second transmission circuit TG2 transmits the signal of the second differential output terminal ND7 to the second node ND9 under the control of the control signals CAP_ON and CAP_ONB.

The first storage unit N55 stores the signal (voltage) of the first node ND8 during a predetermined time period, and the second storage unit N57 stores the signal (voltage) of the second node ND9 during a predetermined time period.

The signal transmitted to the first node ND8 is transferred to the first output terminal ND10 when the switching control signal DCC_CTL has a "low" level, and also the signal transmitted to the second node ND9 is transferred to the second output terminal ND11 when the switching control signal DCC_CTL have the "low" level.

However, when the switching control signal DCC_CTL has a "high" level, then the third transmission circuit TG3 is turned-off, the fist output terminal ND10 is pulled down to the ground voltage VSS, the fourth transmission circuit TG4 is turned off, and the second output terminal ND11 is pulled down to the ground voltage VSS.

The switching control signal DCC_CTL is input into the gates of the respective PMOS transistors P37 and P41, the gates of the respective NMOS transistors N61, N65, N67, and N69, and an inverter I11. The output signal of the inverter I11 is input into the gates of the PMOS transistors P39 and P43 and the gates of the NMOS transistors N59 and N63. The NMOS transistor N61 and PMOS transistor P39, and the NMOS transistor N65 and PMOS transistor P43 form capacitors, respectively.

The duty cycle correction circuit 230 is turned on or turned off depending on the status of the switching control signal DCC_CTL.

Figure 4:
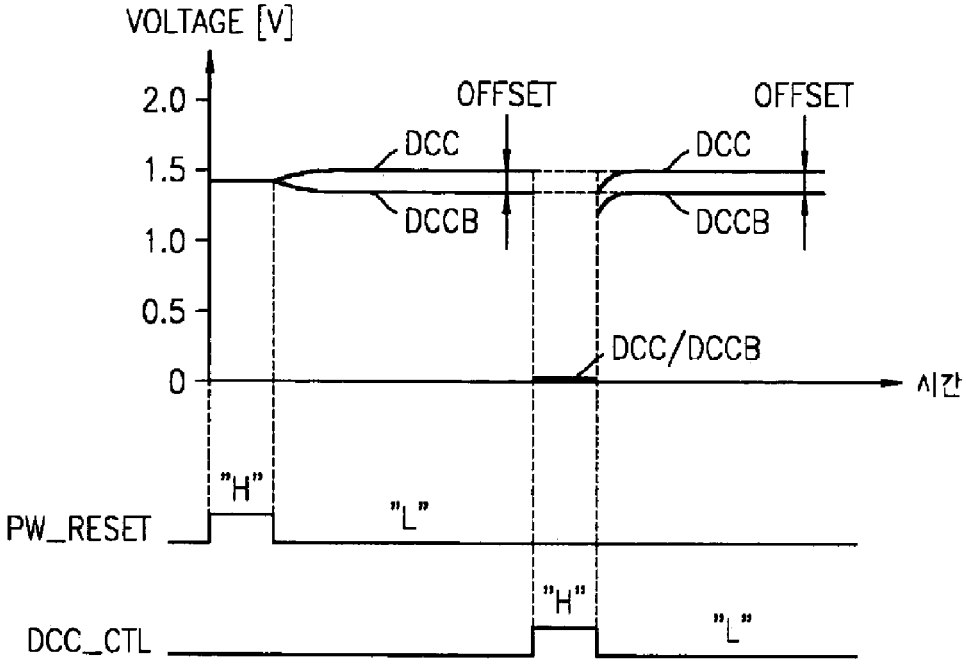
FIG. 4 is an operation timing chart of the duty cycle correction circuit of the delay locked loop.

FIG. 4 is an operation timing chart of the duty cycle correction circuit of the delay locked loop of FIGS. 2 and 3. The bias voltage VIAS, the mode control signal NAPB, and the control signal CAP_ON all have "high" levels ("H"), and the switching control signal DCC_CTL has a "low" level ("L").

A case where the duty cycle of the reference clock signal CLK is 50% is described below with reference to FIGS. 2 through 4.

The differential amplifier 231 receives and amplifies the reference clock signal CLK input from the first input terminal and the complementary reference clock signal CLKB input from the second input terminal, and outputs the amplified result into the first differential output terminal ND6 and the second differential output terminal ND7, respectively.

The first storage unit N55 stores electric charge corresponding to the duty cycle (for example, 45%) of the complementary reference clock signal CLKB, and the second storage unit N57 stores electric charge corresponding to the duty cycle (for example, 55%) of the reference clock signal CLK.

Therefore, a predetermined DC offset is generated between a signal DCCB that is output to the DLL core 210 via the first output terminal ND10, and a signal DCC that is output to the DLL core 210 via the second output terminal ND11.

The DLL core 210 corrects the duty cycle of the internal clock signal ICLK in response to the signals DCC and DCCB output from the duty cycle correction circuit 230. Accordingly, due to repeated interaction between the duty cycle correction circuit 230 and the DLL core 210, the duty cycle of the reference clock signal CLK becomes 50%. If the duty cycle of the reference clock signal CLK is 50%, then the DC offset is zero. Otherwise, if the duty cycle of the reference clock signal CLK becomes more or less than 50%, then the DC offset increases.

However, if the switching control signal DCC_CTL is changed to a "high" level ("H"), then the signal of the first node ND8 is not transmitted to the first output terminal ND10, and also the signal of the second node ND9 is not transmitted to the second output terminal ND11. Also, since the NMOS transistors N67 and N69 of the switching circuit 237 are turned-on when the switching control signal DCC_CTL has the high level, the output signal DCCB of the first output terminal ND10 and the output signal DCC of the second output terminal ND11 are pulled down to the ground voltage VSS. In this case, the electric charge stored in the first storage unit N55 and second storage unit N57 is maintained.

Accordingly, when the switching control signal DCC_CTL is changed to a high level ("H"), then the duty cycle of the reference clock signal CLK is determined depending on the inverters 131, 133, 135, . . . , 137 constituting the clock buffer 130.

If the switching control signal DCC_CTL is changed into a low level ("L"), then the signal of the first node ND8 is transmitted to the first output terminal ND10 and the signal of the second node ND9 is transmitted to the second output terminal ND11, and the NMOS transistors N67 and N69 are turned-off.

Accordingly, the switching circuit 237 outputs to the DLL core 210 the signals DCC and DCCB just before the switching control signal DCC_CTL is changed to the high level ("H"). Thus, the DLL core 210 corrects the duty cycle of the internal clock signal ICLK in response to the signals DCC and DCCB output from the duty cycle correction circuit 230.

Therefore, when a duty cycle error is generated in the DLL 200 including the duty cycle correction circuit 230, the duty cycle of the reference clock signal CLK becomes exactly 50%, regardless of whether a duty cycle error is generated by the clock buffer 130, due to the duty cycle correction circuit 230, and/or due to the clock buffer 130 and duty cycle correction circuit 230.

As described above, according to the present invention, it is possible to correctly analyze the cause of generation of the duty cycle error when the duty cycle error is generated in a DLL including the duty cycle correction circuit capable of being turned on or turned off. Therefore, in the DLL and the system including the DLL, debugging time can be minimized.

Also, it is possible to check whether the duty cycle correction circuit is operating correctly in a DLL including the duty cycle correction circuit according to the present invention.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop (DLL) comprising:

a DLL core adapted to receive an external clock signal and to generate an internal clock signal synchronized to the external clock signal;

a buffer adapted to buffer the internal clock signal and to output differential reference clock signals; and a duty cycle correction circuit adapted to generate first control signals having desired offsets corresponding to differences in duty cycles of the differential reference clock signals, and to output the first control signals to the DLL core under the control of a switching control signal, wherein the DLL core corrects a duty cycle of the internal clock signal in response to the first control signals, wherein in a duty-cycle error analysis mode, the switching control signal selectively turns on and turns off the duty cycle correction circuit to inhibit output of the first control signals to the DLL core, wherein the duty cycle correction circuit comprises:

a differential amplifier having first and second input terminals and first and second differential output terminals, and adapted to receive the differential reference clock signals via the first and second input terminals, to amplify the differential reference clock signals, and to output the amplified differential reference clock signals via the first and second differential output terminals;

a first transmission circuit connected between the first differential output terminal of the differential amplifier and a first node, and adapted to transmit to the first node a first one of the amplified differential reference clock signals appearing at the first differential output terminal of the differential amplifier;

a second transmission circuit connected between the second differential output terminal of the differential amplifier and a second node, and adapted to transmit to the second node a second one of the amplified differential reference clock signals appearing at the second differential output terminal of the differential amplifier;

a first storage unit connected between the first node and a ground voltage, and adapted to store a signal of the first node;

a second storage unit connected between the second node and the ground voltage and adapted to store a signal of the second node; and a switching circuit connected between the first node and a first input terminal of the DLL core, and connected between the second node and a second input terminal of the DLL core, the switching circuit having a control terminal adapted to receive the switching control signal to selectively provide the signals of the first and second nodes to the first and second input terminals of the DLL core as the first control signals, and wherein the first transmission circuit is adapted to provide the first one of the amplified differential reference clock signals to the first node, and the second transmission circuit is adapted to provide the second one of the amplified differential reference clock signals to the second node, while the switching control signal has an activated state and while the switching control signal has a deactivated state.

2. The delay locked loop of claim 1, wherein the switching circuit comprises:

a third transmission circuit adapted to transmit the signal of the first node to the DLL core when the switching control signal has the deactivated state;

a fourth transmission circuit adapted to transmit the signal of the second node to the DLL core when the switching control signal has the deactivated state;

a first pull-down circuit which is connected between the first node and the ground voltage, and pulls down the first node to the ground voltage when the switching control signal has the activated state; and a second pull-down circuit which is connected between the second node and the ground voltage, and pulls down the second node to the ground voltage when the switching control signal has the activated state.

3. The delay locked loop of claim 1, wherein each of the first and second storage units includes a MOS transistor.

4. A delay locked loop (DLL) comprising:

a DLL core adapted to receive an external clock signal and to generate an internal clock signal synchronized to the external clock signal;

a buffer adapted to buffer the internal clock signal and to output differential reference clock signals; and a duty cycle correction circuit adapted to generate first control signals having desired offsets corresponding to differences in duty cycles of the differential reference clock signals, and to output the first control signals to the DLL core under the control of a switching control signal, wherein the DLL core corrects a duty cycle of the internal clock signal in response to the first control signals, wherein in a duty-cycle error analysis mode, the switching control signal selectively turns on and turns off the duty cycle correction circuit to inhibit output of the first control signals to the DLL core, and wherein the duty cycle correction circuit is adapted to receive complementary transmission circuit control signals, and includes first and second storage units adapted, in response to the complementary transmission circuit control signals being activated, to store voltages generated by the differential reference clock signals, and wherein the switching control signal selectively inhibits output of the first control signals to the DLL core while the complementary transmission circuit control signals are activated to store voltages generated by the differential reference clock signals in the first and second storage units.

5. The delay locked loop of claim 4, wherein the switching control signal selectively turns off an output of the duty cycle correction circuit to inhibit output of the first control signals to the DLL core while at a same time the duty cycle correction circuit continues to generate the first control signals having the desired offsets corresponding to differences in duty cycles of the differential reference clock signals.

6. The delay locked loop of claim 4, wherein the delay locked loop further comprises a pad adapted to receive the switching control signal.

7. The delay locked loop of claim 4, wherein the delay locked loop further comprises a mode register set for generating the switching control signal.

8. The delay locked loop of claim 4, wherein the buffer comprises a plurality of serially interconnected inverters adapted to generate the differential reference clock signals.

9. The delay locked loop of claim 8, wherein each of the plurality of inverters includes one PMOS transistor and one NMOS transistor, which are connected serially.

10. A delay locked loop (DLL) comprising:

a DLL core adapted to receive an external clock signal and to generate an internal clock signal synchronized to the external clock signal;

a buffer adapted to buffer the internal clock signal and to output differential reference clock signals; and a duty cycle correction circuit adapted to generate first control signals having desired offsets corresponding to differences in duty cycles of the differential reference clock signals, and to output the first control signals to the DLL core under the control of a switching control signal, wherein the DLL core corrects a duty cycle of the internal clock signal in response to the first control signals, wherein in a duty-cycle error analysis mode, the switching control signal selectively turns on and turns off the duty cycle correction circuit to inhibit output of the first control signals to the DLL core, wherein the duty cycle correction circuit includes:

first and second outputs for outputting the first control signals;

first and second storage units;

a transmission circuit adapted to receive complementary transmission circuit control signals, and in response to complementary transmission circuit control signals being activated, to store voltages generated by the differential reference clock signals in the first and second storage units; and a switching circuit adapted, in response to the switching control signal, to selectively connect the stored voltages of the first and second storage units to the first and second outputs as the first control signals, and wherein the switching circuit responds to the switching control signal to disconnect the stored voltages of first and second storage units from the first and second outputs while the complementary transmission circuit control signals are activated to store the voltages generated by the differential reference clock signals in the first and second storage units.

*11. A delay locked loop (DLL) circuit comprising:*

*a DLL core configured to receive an external clock signal and generate an internal clock signal synchronized to the external clock signal; and,*

*a buffer connected to said DLL core configured to buffer the internal clock signal and generate a clock output signal and a complementary clock output signal; and,*

*a duty cycle correction circuit connected to said buffer configured to receive the clock output signal and complementary clock output signal generated by said buffer and to provide to said DLL core a duty cycle correction output, and a complementary duty cycle correction output comprising;*

*a first transmission circuit connected between the first differential output terminal of the differential amplifier and a first node, and adapted to transmit to the first node a first one of the amplified differential reference clock signals appearing at the first differential output terminal of the differential amplifier;*

*a second transmission circuit connected between the second differential output terminal of the differential amplifier and a second node, and adapted to transmit to the second node a second one of the amplified differential reference clock signals appearing at the second differential output terminal of the differential amplifier;*

*a differential amplifier having inputs configured to receive the clock output signal and the complementary clock output signal from said buffer; and,*

*a first storage unit connected to a first output of said differential amplifier, connected to the duty cycle correction output, and configured to store a first charge corresponding to the duty cycle of the internal clock signal, and,*

*a second storage unit connected to the second output of said differential amplifier, connected to the complementary duty cycle correction output, and configured to store a second charge corresponding to the duty cycle of the internal clock signal, and,*

*an equalize circuit connected between the first output and the second output of said differential amplifier having an input to receive a reset signal, wherein said duty cycle correction circuit provides a differential signal on the duty cycle output and the complementary duty cycle output based the duty cycle of the internal clock signal clock signal when the reset signal is deactivated, and provides an equalized signal on the first and second outputs when the reset signal is activated;*

*a switching circuit connected between the first node and a first input terminal of the DLL core, and connected between the second node and a second input terminal of the DLL core, the switching circuit having a control terminal adapted to receive the switching control signal to selectively provide the signals of the first and second nodes to the first and second input terminals of the DLL core as the first control signals, and wherein the first transmission circuit is adapted to provide the first one of the amplified differential reference clock signals to the first node, and the second transmission circuit is adapted to provide the second one of the amplified differential reference clock signals to the second node, while the switching control signal has an activated state and while the switching control signal has a deactivated state.*

*12. A delay locked loop (DLL) circuit as in claim 11, wherein said equalize circuit includes a transistor with a gate connected to the reset signal.*

*13. A delay locked loop (DLL) circuit as in claim 12, wherein said transistor is a PMOS transistor and the reset signal has a high level when deactivated and a low level when activated.*

*14. A delay locked loop (DLL) circuit as in claim 11, wherein said first storage unit and second storage unit are both MOS transistors.*

*15. A delay locked loop (DLL) circuit as in claim 14, wherein said first storage unit is a NMOS transistor having a gate connected to the first output of said differential amplifier and the source/drain connected to a supply voltage, and said second storage unit is a NMOS transistor having a gate connected to the second outputs of said differential amplifier and the source/drain connected to a supply voltage.*

*16. A delay locked loop (DLL) circuit as in claim 11, wherein the duty cycle is corrected to a 50% duty cycle.*

*17. A delay locked loop (DLL) circuit as in claim 11, wherein the equalize circuit is directly connected between the first output and the second output of said differential amplifier.*

*18. A delay locked loop (DLL) circuit as in claim 11, wherein the first storage unit is connected to the first output of the differential amplifier through a first transmission gate and the second storage unit is connected to the second output of the differential amplifier through a second transmission gate.*

*19. A delay locked loop (DLL) circuit as in claim 11, wherein the first storage unit is connected to the duty cycle correction output through a first transmission gate and the second storage unit is connected to the complementary duty cycle correction output through a second transmission gate.*

*20. A delay locked loop (DLL) circuit as in claim 19, wherein the first transmission gate and the second transmission gate are controlled by a pad.*

*21. A delay locked loop (DLL) circuit as in claim 19, wherein the first transmission gate and the second transmission gate are controlled by a mode register.*

*22. A delay locked loop (DLL) circuit as in claim 11, wherein the equalized signal has a voltage level between the voltage levels of the duty cycle correction output and the complementary duty cycle correction output when the reset signal is deactivated.*

*23. A method for correcting duty cycle error in a delay locked loop (DLL) circuit that includes a DLL core configured to receive an external clock signal and generate an internal clock signal synchronized to the external clock signal and a buffer connected to said DLL core configured to buffer the internal clock signal and generate a clock output signal and a complementary clock output signal comprising the steps of:*

*amplifying the clock output signal and the complementary clock output signal to allow processing, and,*

*integrating the clock output signal to produce a duty cycle correction signal indicating the duty cycle of the internal clock signal, and,*

*integrating the complimentary clock output signal to produce a complementary duty cycle correction signal indicating the duty cycle of the internal clock signal,*

*equalizing the duty cycle correction signal the complementary duty cycle correction signal when a reset signal is activated and inhibiting equalization of the duty cycle correction signal the complementary duty cycle correction signal when a reset signal is deactivated, and,*

*sending the duty cycle correction signal and the complementary duty cycle correction signal to the DLL core to correct the duty cycle of the internal clock signal when the reset signal is deactivated and to not correct the duty cycle of the internal clock signal when the reset signal is activated.*

*24. A method for correcting duty cycle errors in a delay locked loop (DLL) as in claim 23, wherein the duty cycle is corrected to a 50% duty cycle.*

*25. A method for correcting duty cycle errors in a delay locked loop (DLL) as in claim 23, wherein the reset signal is activated when there is no duty cycle error.*

*26. A method for correcting duty cycle errors in a delay locked loop (DLL) as in claim 23, wherein the reset signal is provided by a mode register.*

*27. A method for correcting duty cycle errors in a delay locked loop (DLL) as in claim 23, wherein the reset signal is provided by a pad.*

*28. A method for correcting duty cycle errors in a delay locked loop (DLL) as in claim 23, wherein two fixed voltage signals are sent to the DLL core when the reset signal is activated.*

*29. A method for correcting duty cycle errors in a delay locked loop (DLL) as in claim 23, wherein two ground signals are sent to the DLL core when a switching control signal is activated.*

*30. A system for providing complementary clock signals from an external clock signal comprising:*

*a DLL core configured to receive an external clock signal and generate an internal clock signal synchronized to the external clock signal; and,*

*a buffer connected to said DLL core configured to buffer the internal clock signal and generate a clock output signal and a complementary clock output signal; and,*

*a duty cycle correction circuit connected to said buffer configured to receive the clock output signal and complementary clock output signal generated by said buffer and to provide to said DLL core a duty cycle correction output, and a complementary duty cycle correction output comprising;*

*a first transmission circuit connected between the first differential output terminal of the differential amplifier and a first node, and adapted to transmit to the first node a first one of the amplified differential reference clock signals appearing at the first differential output terminal of the differential amplifier;*

*a second transmission circuit connected between the second differential output terminal of the differential amplifier and a second node, and adapted to transmit to the second node a second one of the amplified differential reference clock signals appearing at the second differential output terminal of the differential amplifier;*

*a differential amplifier having inputs configured to receive the clock output signal and the complementary clock output signal from said buffer; and,*

*a first storage unit connected to a first output of said differential amplifier connected to the duty cycle correction output, and configured to store a first charge corresponding to the duty cycle of the internal clock signal, and,*

*a second storage unit connected to the second output of said differential amplifier, connected to the complementary duty cycle correction output, and configured to store a second charge corresponding to the duty cycle of the internal clock signal, and,*

*an equalize circuit connected between the first output and the second output of said differential amplifier having an input to receive a reset signal, wherein said duty cycle correction circuit provides a differential signal on the duty cycle output and the complementary duty cycle output based the duty cycle of the internal clock signal clock signal when the reset signal is deactivated, and provides an equalized signal on the first and second outputs when the reset signal is activated,*

*a switching circuit connected between the first node and a first input terminal of the DLL core, and connected between the second node and a second input terminal of the DLL core, the switching circuit having a control terminal adapted to receive the switching control signal to selectively provide the signals of the first and second nodes to the first and second input terminals of the DLL core as the first control signals, and wherein the first transmission circuit is adapted to provide the first one of the amplified differential reference clock signals to the first node, and the second transmission circuit is adapted to provide the second one of the amplified differential reference clock signals to the second node, while the switching control signal has an activated state and while the switching control signal has a deactivated state.*

*31. A system for providing complementary clock signals as in claim 30, wherein said equalize circuit includes a transistor with a gate connected to the reset signal.*

*32. A system for providing complementary clock signals as in claim 31, wherein said transistor is a PMOS transistor and the reset signal has a high level when deactivated and a low level when activated.*

*33. A system for providing complementary clock signals as in claim 30, wherein said first storage unit and second storage unit are both MOS transistors.*

*34. A system for providing complementary clock signals as in claim 33, wherein said first storage unit is a NMOS transistor having a gate connected to the first output of said differential amplifier and the source/drain connected to a supply voltage, and said second storage unit is a NMOS transistor having a gate connected to the second outputs of said differential amplifier and the source/drain connected to a supply voltage.*

*35. A system for providing complementary clock signals as in claim 30, wherein the clock output signal and complementary clock output signal are corrected to a substantially 50% duty cycle.*

*36. A system for providing complementary clock signals as in claim 30, wherein the equalize circuit is directly connected between the first output and the second output of said differential amplifier.*

*37. A system for providing complementary clock signals as in claim 30, wherein the first storage unit is connected to the first output of the differential amplifier through a first transmission gate and the second storage unit is connected to the second output of the differential amplifier through a second transmission gate.*

*38. A system for providing complementary clock signals as in claim 30, wherein the first storage unit is connected to the duty cycle correction output through a first transmission gate and the second storage unit is connected to the complementary duty cycle correction output through a second transmission gate.*

*39. A system for providing complementary clock signals as in claim 38, wherein the first transmission gate and the second transmission gate are controlled by a pad.*

*40. A system for providing complementary clock signals as in claim 38, wherein the first transmission gate and the second transmission gate are controlled by a mode register.*

*41. A system for providing complementary clock signals as in claim 30, wherein the equalized signal has a voltage level between the voltage levels of the duty cycle correction output and the complementary duty cycle correction output when the reset signal is deactivated.*

* * * * *